(12) United States Patent
Izawa et al.

(10) Patent No.: US 6,597,296 B2
(45) Date of Patent: Jul. 22, 2003

(54) CENTER PHASE VERIFYING CIRCUIT AND CENTER PHASE VERIFYING METHOD

(75) Inventors: Kazunari Izawa, Tokyo (JP); Hidekatsu Masuko, Miyagi (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/120,481

(22) Filed: Apr. 12, 2002

(65) Prior Publication Data

US 2002/0154043 A1 Oct. 24, 2002

(30) Foreign Application Priority Data

Apr. 20, 2001 (JP) ........................................ 2001-122403

(51) Int. Cl.[7] .............................................. H03M 9/00
(52) U.S. Cl. ........................ 341/100; 375/371; 375/375
(58) Field of Search ................................. 341/100, 101; 375/371, 372, 373, 374, 375

(56) References Cited

U.S. PATENT DOCUMENTS

| | | | | |
|---|---|---|---|---|
| 4,119,796 A | * | 10/1978 | Jones | ........................ 375/362 |
| 4,189,622 A | * | 2/1980 | Foshee | ....................... 375/373 |
| 5,210,754 A | * | 5/1993 | Takahaahi et al. | .......... 375/367 |
| 2002/0044618 A1 | * | 4/2002 | Buchwald et al. | .......... 375/371 |

* cited by examiner

Primary Examiner—Howard L. Williams
(74) Attorney, Agent, or Firm—Foley & Lardner

(57) ABSTRACT

A center phase decision circuit for deciding a center phase of a data signal, in which, in case the data signal is subjected to disturbance in the signal waveform, the signal is corrected for the disturbance to re-establish normal communication.

A circuit for deciding the center phase of a data signal input as n-phase serial data, where n is an integer not less than 2, includes a serial to parallel converter circuit for serial to parallel conversion of the data signal and for outputting, using each of a plural number of output ports, parallel data converted by the serial to parallel conversion from the serial data with a period equal to n times the period of the data signal, a plural number of phase comparator circuits for comparing the phases of the parallel data output from the respective output ports to detect the phase non-coincidences, a plural number of counters for counting the number of times of detection of phase non-coincidences in the respective output ports and a circuit for deciding the center phase based on the number of times of the phase non-coincidences as counted.

13 Claims, 6 Drawing Sheets

CENTER PHASE VERIFYING CIRCUIT AND CENTER PHASE VERIFYING METHOD

FIELD OF THE INVENTION

This invention relates to detection and correction of disturbance in the waveform of data signal. More particularly, it relates to a center phase decision circuit and to a center phase decision method in which an optimum center position is decided to process the data signal.

BACKGROUND OF THE INVENTION

There has so far been adopted a technique of serial to parallel converting data signal which is input as n-phase serial data, into a plural number of, for example, n parallel data.

FIG. 4 shows an example of a conventional circuit for a three-phase case. The circuit is comprised of a first flip/flop 81, a second flip/flop 82, and a ⅓ frequency divider 83. This circuit receives data signal from a terminal IN_Data and clock for the data signal from a terminal IN_CLK.

As shown in an instance of FIG. 5, the ⅓ frequency divider circuit 83 generates and outputs, based on the input clock, three types of clocks with periods associated with the period of the original data signal, by a period thrice as long as the period of the original data signal. The three types of clocks are designated respectively by ①, ②, and ③ in the timing waveforms of the frequency divider circuit in FIG. 5.

In association with the three types of clocks, the second flip/flop 82 sequentially converts the data signal, input via the first flip/flop 81 at the clocked time point, into parallel data having a period thrice as long as the period of the original data signal.

SUMMARY OF THE DISCLOSURE

The conventional technique has, however, the following inconveniences:

As shown in an instance of the conventional circuit, shown in FIG. 6, if a jitter component (disturbance in the waveform) is produced in the data with respect to the clock, there is produced an area indefinite in phase, which gives rise to a high possibility of erroneous recognition or processing of the data signal.

In FIG. 6, illustrating timing waveforms in case of a conventional circuit as shown in FIG. 4, a disturbance is produced in the waveform of the input data signal and hence the period of the signal output from the flip/flop is not coincident with clock period, thus leading to incorrect readout of the data signal.

As shown in FIG. 6, there are some areas indefinite in phase in the output signal sequence of the first flip/flop 81 and the output of the second flip/flop 82 is caused to be indefinite in phase in case the frequency divided clock signal output from the frequency divider circuit is such a type as phase ① and ③.

Accordingly, it is an object of the present invention to overcome the above-described inconveniences of the prior art and to provide a phase correction circuit, a center phase decision circuit and a center phase decision method, in which, even when jitter component is produced in the data with respect to a clock signal, it is possible to accomplish correct processing of the data signal.

To achieve the foregoing and other objectives, a center phase decision circuit in accordance with one aspect of the present invention, which decides a center phase of data signal input as n-phase serial data, where n is an integer not less than 2, comprises: a serial to parallel converter circuit for outputting, via a plural number of output ports, parallel data obtained on serial to parallel conversion of said data signal at a period equal to n times the period of the data signal; a phase comparator circuit for comparing phases of parallel data output from each of said output ports for detecting phase non-coincidence; a counter for counting the number of times of detection of phase non-coincidence in each of said output ports by said phase comparator circuit; and a circuit for deciding said center phase based on the counted number of times of occurrences of phase non-coincidence.

In the center phase decision circuit in accordance with another aspect of the present invention, said serial to parallel converter circuit outputs parallel data, obtained on serial to parallel conversion of bits of respective periods of said data signal, at a period equal to n times the period of said data signal, from each of (n+1) output ports and said phase comparator circuit compares the phase of said parallel data output by the output port, to which the i-th period of said data signal, where i=1 to n, has been assigned, with the phase of the parallel data output by the output port to which the (i+1)-th period of said data signal has been assigned, to detect possible phase non-coincidence therebetween.

In the center phase decision circuit in accordance with further aspect of the present invention, there are provided a maximum value decision circuit for detecting the output port in which the number of times of occurrence of phase non-coincidence as counted by said counter is of a maximum value and a circuit for selecting the center phase based on a preset correspondence relationship between the combination of the output ports in which the number of times of occurrence of the phase non-coincidence is maximum and the output port in which the phase of the output parallel data is determined to be said center phase.

A phase correction circuit in accordance with another aspect of the present invention, which corrects phase disturbance of data signal input as n-phase serial data, where n is an integer not less than 2, comprises: a serial to parallel conversion circuit for outputting, via a plural number of output ports, parallel data obtained on serial to parallel conversion of said data signal at a period equal to n times the period of the data signal; a phase comparator circuit for comparing phases of parallel data output from each of said output ports for detecting phase non-coincidence; a counter for counting the number of times of detection of phase non-coincidence in each of said output ports by said phase comparator circuit; and a circuit for deciding said center phase based on the counted number of times of phase non-coincidence and for converting the serial to parallel converted data signal into serial data having the correct period based on the decided center phase to output resulting serial data.

In the phase correction circuit in accordance with another aspect of the present invention, said serial to parallel converter circuit outputs parallel data, obtained on serial to parallel conversion of bits of respective periods of said data signal, at a period equal to n times the period of said data signal, from each of (n+1) output ports and said phase comparator circuit compares the phase of said parallel data output by the output port, to which the i-th period of said data signal, where i=1 to n, has been assigned, with the phase of the parallel data output by the output port to which the (i+1)-th period of said data signal has been assigned, to detect possible phase non-coincidence therebetween.

In the phase correction circuit in accordance with further aspect of the present invention, there are provided a maximum value decision circuit for detecting the output port in which the number of times of occurrence of phase non-coincidence as counted by said counter is of a maximum value and a circuit for selecting the center phase based on a preset correspondence relationship between the combination of the output ports in which the number of times of occurrence of the phase non-coincidence is maximum and the output port in which the phase of the output parallel data is determined to be said center phase.

A method in accordance with another aspect of the present invention, which decides a center phase of data signal input as n-phase serial data, where n is an integer not less than 2, comprises the steps of:

serial to parallel converting said data signal to output parallel data obtained on the serial to parallel conversion at a period equal to n times the period of the data signal via a plural number of output ports;

comparing the phases of parallel data output from each of said output ports for detecting phase non-coincidence;

counting the number of times of detection of phase non-coincidence in each of said output ports; and deciding the center phase based on the counted number of times of detection of phase non-coincidence.

With the method in accordance with another aspect of the present invention, in the step of the serial to parallel conversion, the parallel data, obtained on serial to parallel conversion of bits of respective periods of said data signal, at a period equal to n times the period of said data signal, are output from each of (n+1) output ports and in the step of the phase comparison, the phase of said parallel data, output by the output port, to which i-th period of said data signal, where i=1 to n, has been assigned, with the phase of the parallel data output by the output port, to which (i+1)-th period of said data signal has been assigned, are compared to detect possible phase non-coincidence therebetween.

In the method in accordance with further aspect of the present invention, there are provided the steps of: detecting the output port in which the number of times of occurrences of phase non-coincidences as counted by said counter is of a maximum value; and deciding the center phase based on a preset correspondence relationship between the combination of the output ports in which the number of times of occurrence of the phase non-coincidence is maximum and the output port in which the phase of the output parallel data is determined to be said center phase.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will be explained in detail with reference to the drawings.

Figure 1:
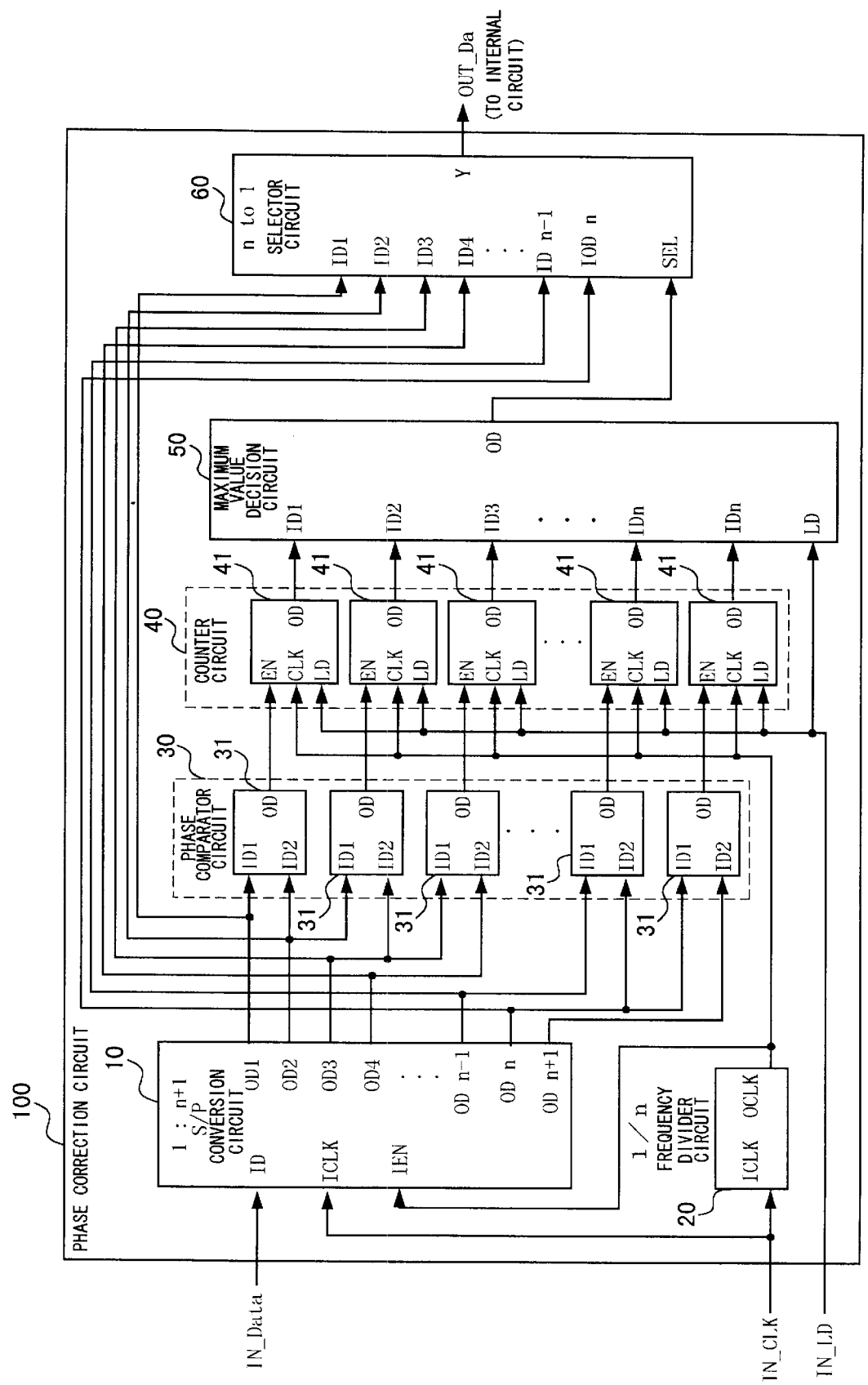
FIG. 1 is a block diagram showing the structure of a phase correction circuit according to a first embodiment of the present invention.

FIG. 1 is a block diagram showing a structure of a phase correction circuit 100 in accordance with a first embodiment of the present invention.

The phase correction circuit 100 of the present embodiment receives n-phase serial data input to decide a center phase of the received data signal. In case the data signal is disturbed in its signal waveform, the signal is appropriately corrected for its waveform disturbance, based on the decided center phase, to output the corrected data signal. It is noted that "n" is a constant integer not less than 2, there being no particular limitation to its specific magnitude.

Referring to FIG. 1, the phase correction circuit 100 of the present embodiment includes a serial to parallel converter circuit 10, a frequency divider circuit 20, a phase comparator circuit 30, a counter circuit 40, a maximum value decision circuit 50 and a selector circuit 60. The phase correction circuit 100 has an input terminal of data signal for receiving n-phase serial data (IN_Data), an input terminal for receiving clock signal (IN_CLK) and a phase decision detection time control terminal for receiving a command for the center phase decision (IN_LD). The phase correction circuit 100 receives data, clock and command from outside from these respective terminals.

A 1:(n+1) serial to parallel (S/P) converter circuit 10 converts the n-phase serial data input (IN_Data) into parallel data by serial to parallel conversion.

The 1:(n+1) serial to parallel converter circuit 10 has an input port ID for receiving the n-phase serial data, a clock input port ICLK for receiving a clock signal IN_CLK, an input port IEN for receiving a control signal which is 1/n frequency divided signal of the clock signal IN_CLK, and n+1 pieces of output ports ODI to ODn+1 for outputting in parallel n+1 bits data obtained by serial to parallel conversion.

The parallel data obtained on serial to parallel conversion of bits each of which corresponds to each period of the data signal, with the period equal to n times the period of the data signal, are output from respective ones of "n+1" output ports OD1–ODn+1.

It should be noted that the period of the parallel data is n times the period of the data signal, with the number of the output ports of the serial to parallel converter circuit 10 being "n+1". That is, at the output port outputting the bit of the first period of the data signal and the output port outputting the bit of the latest period of the data signal, the output parallel data are same except that these are separated from each other by one period (which is equal to n times the period of the data signal).

The 1/n frequency divider circuit 20 generates n types of clocks, which are associated with the period of the original data signal, and which are of a frequency equal to 1/n of the clock frequency, based on the clock input (IN_CLK), and outputs the generated.

The frequency divided clock signal output from the port OCLK of the 1/n frequency divider circuit 20 is provided in common to the input port IEN of the 1:(n+1) serial to parallel converter circuit 10 and to the clock input port CLK of each counter 41.

The phase comparator circuit 30, including n pieces of comparators 31, compares the phase of each parallel data of (n+1) types obtained on conversion by the serial to parallel converting circuit 10, together in n sets of each neighboring phases of the original data signal with the phase of the two parallel data being.

The i-th (where i=1 to n) comparator 31 has two input ports for receiving respectively a pair of signals output from two neighboring i-th and (i+1)-th output ports ODi and ODi+1 of the 1:(n+1) serial to parallel converter circuit 10 for comparing the pair of signals received to output a comparison result from an output port OD.

The counter circuit 40 includes n pieces of counters for counting the number of times of non-coincidence for the n sets of the parallel data as detected by the phase comparator 30.

More precisely, the counter circuit 40 includes n pieces of counters 41, each of which has an input port EN for receiving the comparison result signal output from the output port OD of the associated comparator 31, a clock input port CLK for receiving as a counter clock the frequency divided clock signal output from the 1/n frequency divider circuit 20, an input port LD for receiving a control signal provided at a phase decision detection time control terminal IN_LD and an output port OD for outputting a count value.

In case of the input port LD being set in an inactive state, the counter 41 executes its count operation and in case of the input port LD being set in an active state, the counter 41 is halted. The counter 41, in its count operation, up-counts based on the clock signal fed to the clock input port CLK, in case the signal fed to the port EN indicates phase non-coincidence.

The maximum value decision circuit 50 decides on the maximum number of counts of the non-coincidences from among the numbers of times of non-coincidences as counted by the counter 40.

More precisely, the maximum value decision circuit 50 has n pieces of input ports ID1 to IDn for receiving output signals respectively output from n pieces of counters 41, an input port LD for receiving the control signal from the terminal IN_LD and an output port OD for outputting a detected result. In case of the input port LD being set in an active state (high level), the maximum value decision circuit 50 detects a counter which takes a maximum count value from among the count values received respectively at input ports ID1 to IDn to output a detected result from the output port OD.

The n to 1 selector circuit 60 has n pieces of input ports for receiving signals output from the 1st output port OD1 to the n-th output port of the 1:(n+1) serial to parallel converter circuit 10, a input port SEL for receiving a detection result output by the maximum value decision circuit 50, and an output port Y for outputting a selected signal, in which the output port Y is connected to a terminal OUT_Dn.

The n to 1 selector circuit 60 determines the center phase from among signals received by the input ports ID1–IDn based on the detection result output from the maximum value decision circuit 50 and received by the input port SEL.

For determining the center phase by this selector circuit 60, it is possible to preset the correspondence relationship between the combinations of the output ports outputting the maximum number of times of the phase non-coincidence and the output port the phase of output parallel data of which is determined as the center phase, and to give a decision as to the center phase based on this correspondence relationship. In setting the correspondence relationship for this case, it is possible to preset the output port, the output parallel data of which is most spaced in phase from the output parallel data from the respective output ports corresponding to the combination of the output ports which produces the maximum number of times of phase non-coincidences, as being an output port outputting the parallel data having the center phase.

The n to 1 selector circuit 60 converts the serial to parallel converted data signal into serial data of the correct period, which is based on the decided center phase, and outputs the so converted serial data at an output terminal (OUT_Da).

The selector circuit 60 is so adapted to execute the above-described center phase decision processing responsive to a command input from the phase decision detection time control terminal (IN_LD).

Figure 2:
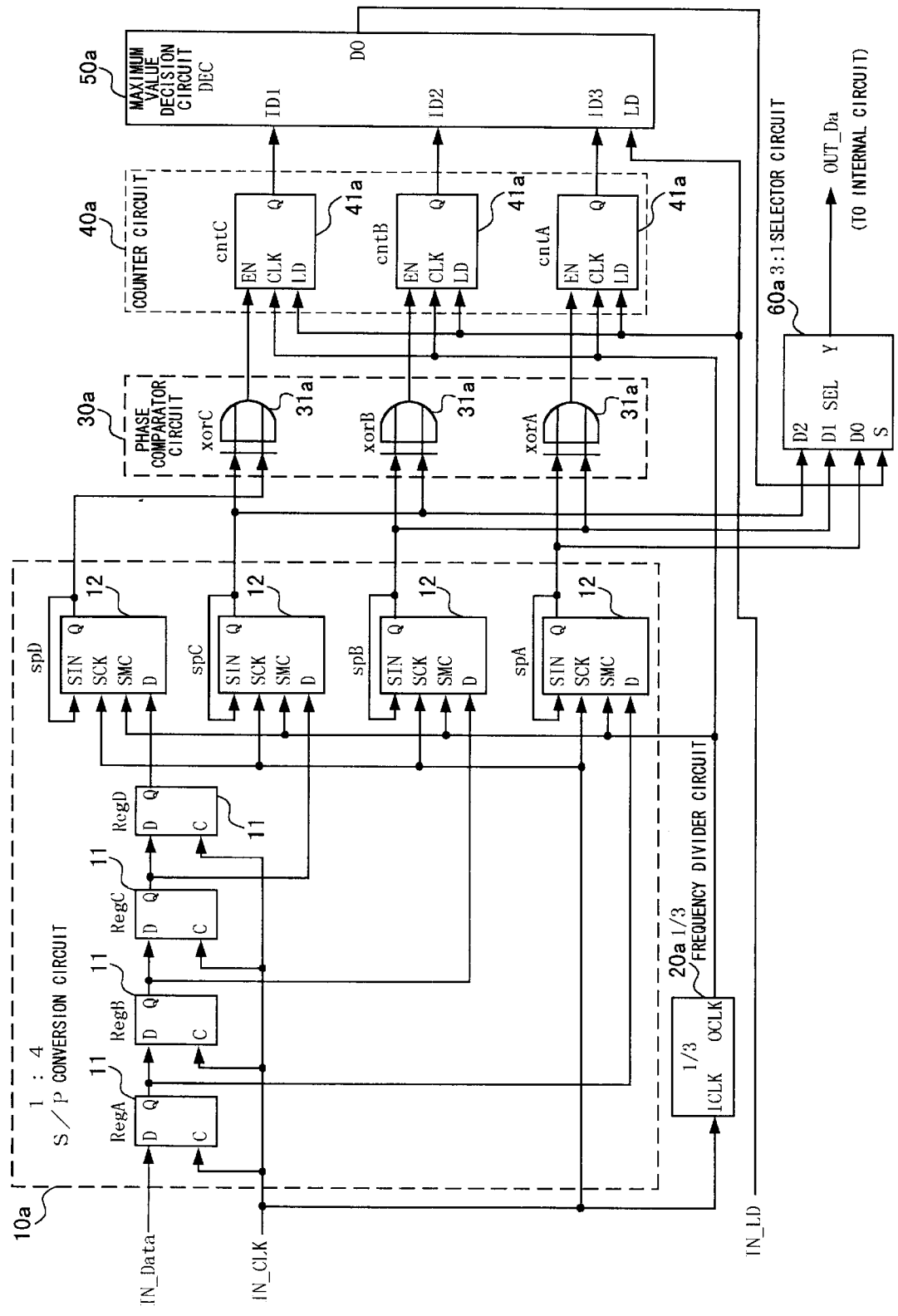
FIG. 2 is a block diagram showing the structure of an embodiment of the phase correction circuit of the present invention for deciding the center phase for a three phase case.
Figure 3:
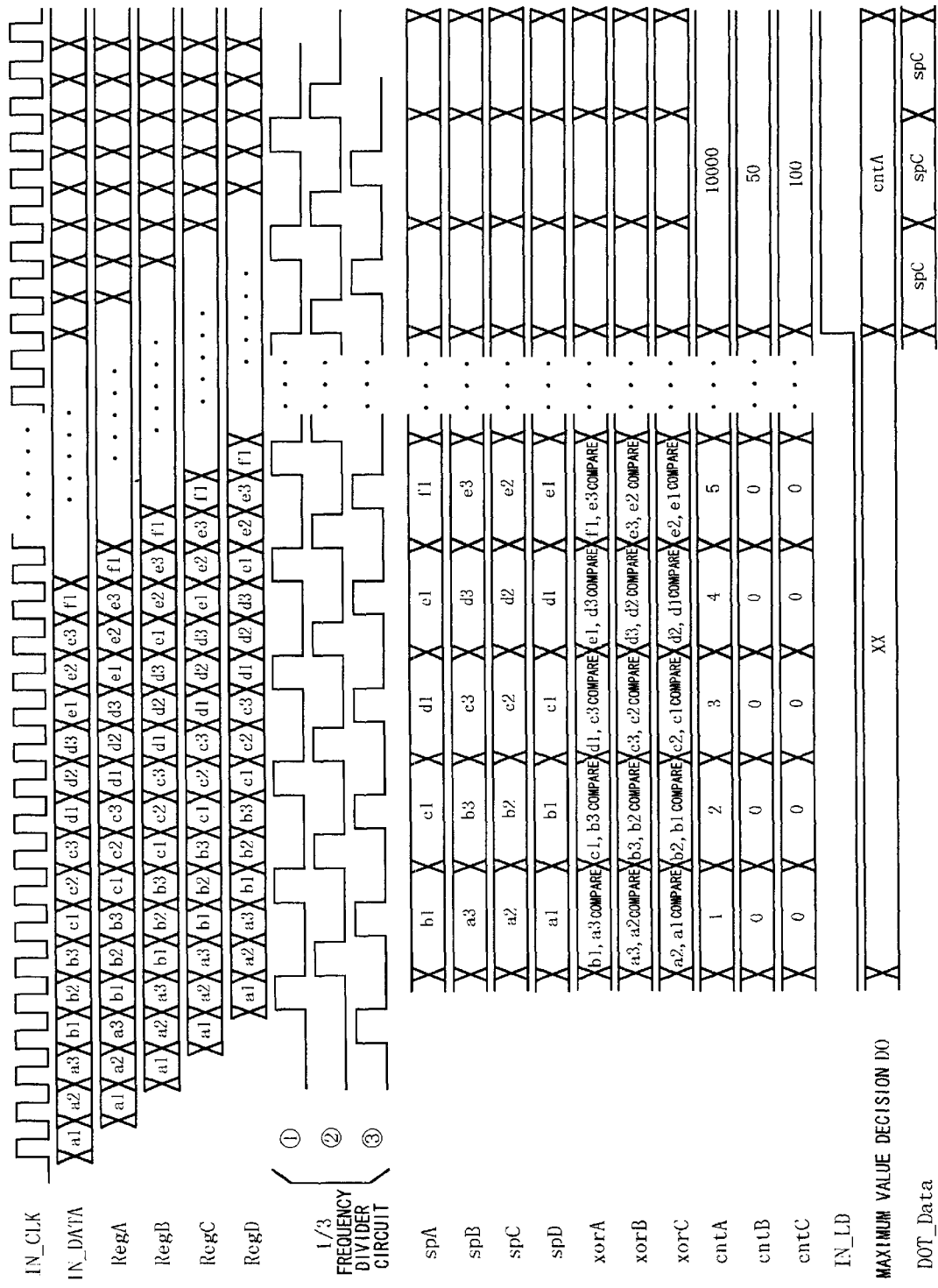
FIG. 3 is a timing chart for illustrating the operation of a phase correction circuit according to a second embodiment of the present invention.
Figure 4:
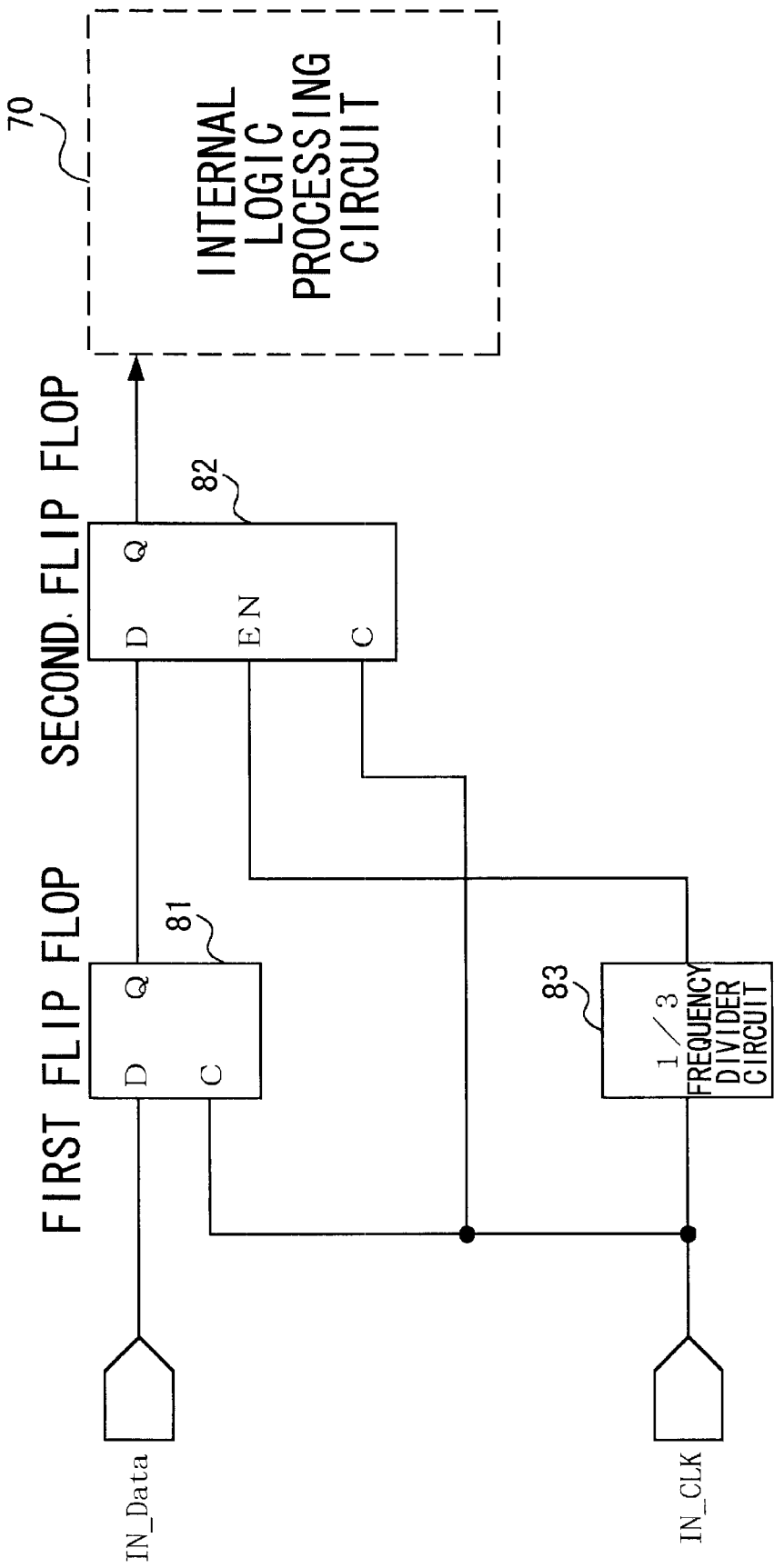
FIG. 4 shows the structure of a conventional circuit.
Figure 5:
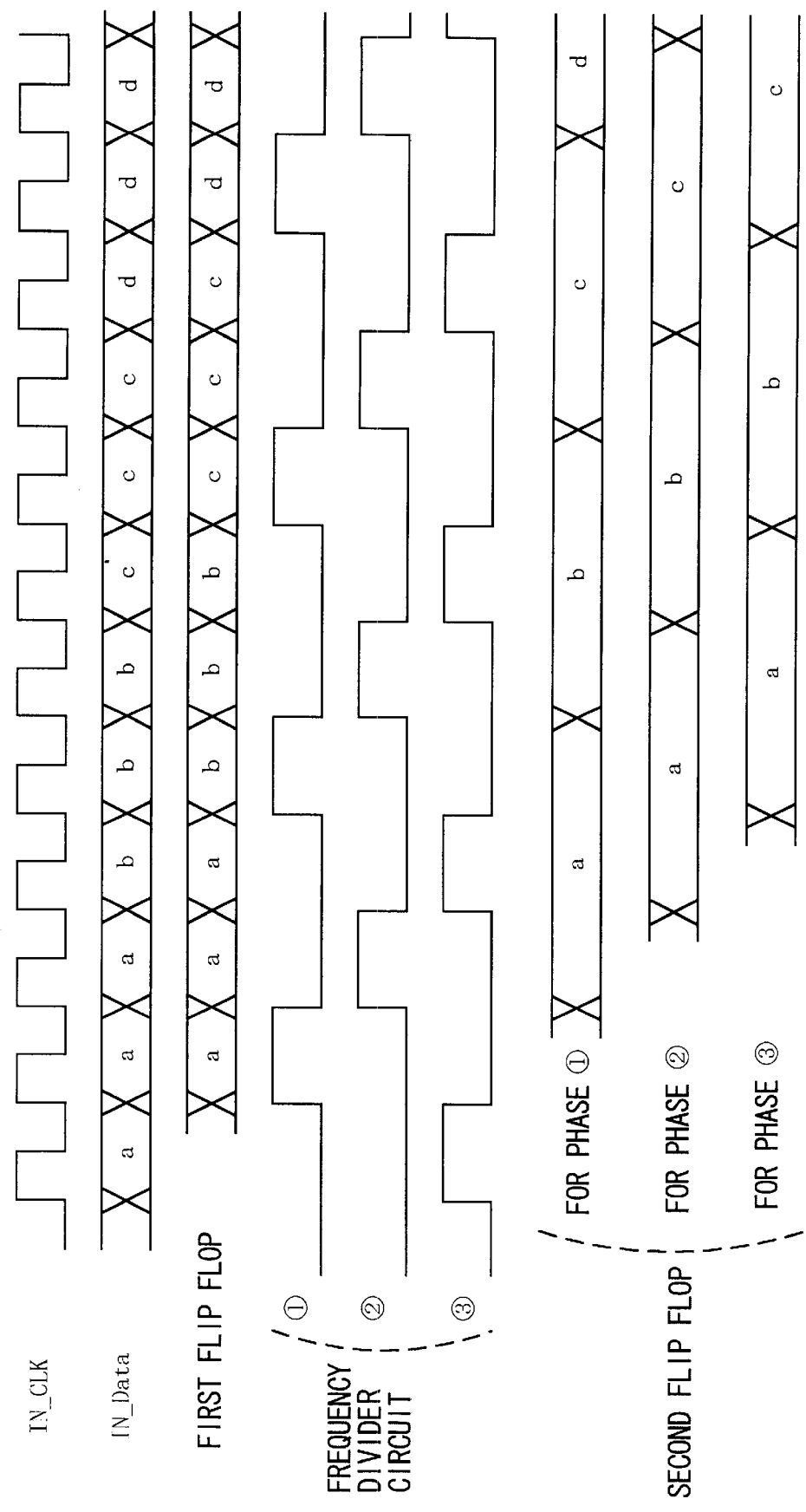
FIG. 5 is a timing chart showing the circuit operation during the time of normal operation of the conventional circuit shown in FIG. 4.
Figure 6:
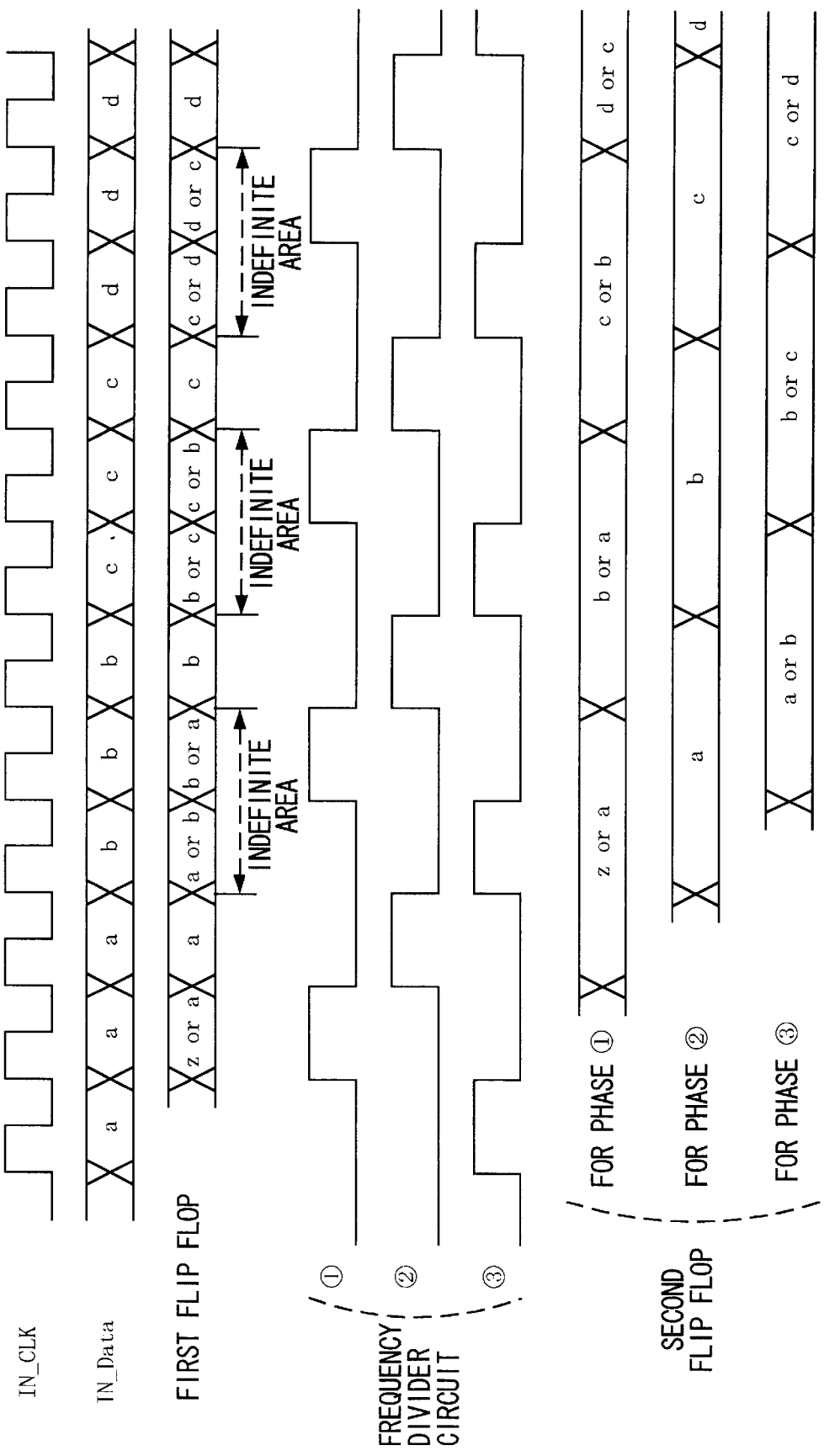
FIG. 6 is a timing chart showing the operation of the conventional circuit shown in FIG. 4 in case of occurrence of disturbance in the waveform in the data signal.

FIG. 2 is a block diagram showing the structure of an embodiment of the phase correction circuit of the present invention for deciding the center phase for the three phase case. FIG. 3 is a timing chart for illustrating the operation of the phase correction of the present embodiment. The operation is based on the rising edge of the clock input.

Referring to FIGS. 2 and 3, the present embodiment of the phase correction circuit includes, for deciding the center phase for the three phase case, a 1:4 serial/parallel converting circuit 10a, a ⅓ frequency divider circuit 20a, a phase comparator circuit 30a, having three comparators 31a (A to C), that is, exclusive OR circuits (xor A, xor B and xor C), a counter circuit 40a having three counters 41a (A to C) (cnt A, cnt B and cnt C), a maximum value decision circuit 50a and a 3:1 selector circuit 60a.

The 1:4 serial to parallel converter circuit 10a includes four output ports 12 (A to D) (sp A, sp B, sp C and sp D) for outputting parallel data and four registers 11 (A to D), relaying data transmission to the respective output ports (Reg A, Reg B, Reg C and Reg D).

The output ports 12 (A to D) (sp A, sp B, sp C and sp D) are respectively made up of flip/flops, each of which has a SMC(Scan Mode Control) port and a SIN(Scan In) port, a SCK(Scan Clock) port, a data input port D and a data output port Q. In each flip/flop, the SMC port receives the frequency divided clock output from the ⅓ frequency divider circuit 20a, the SCK port receives a clock signal from the terminal IN_CLK, while the SIN port is connected to the data output port Q. When the SMC port is at a low level, the flip/flop is made to be in scan mode and samples the signal fed to the SIN port (the output data from the data output port Q is fed to the SIN port) to output the sampled data from the output port Q and when the SMC port is at a high level, the flip/flop is made to be in a normal mode and samples the signal fed to the data input port D to output the sampled data from the output port Q. Accordingly, each flop/flop samples and outputs data fed to the data input port D at a period 3 times the period of the clock signal IN_CLK.

The 1:4 serial to parallel converter circuit 10a is fed with three-phase serial data (IN_Data) to output four-phase parallel data, based on the output clock (OCLK) of the ⅓ frequency divider 20*a*. The phase comparator circuit 30*a* compares the phases of the so output four-phase parallel data from one set of two parallel data with neighboring phases to another. The comparator 31*a* (xor A) compares a pair of signals output from two output ports 12 (sp A and sp B), the comparator 31*a* (xor B) compares a pair of signals output from two output ports 12 (sp B and sp C), and the comparator 31*a* (xor C) compares a pair of signals output from two output ports 12 (sp C and sp D).

When the phase decision detection time control terminal (IN_LD) is at a low level, the number of times on non-coincidence as detected by the phase comparator circuits 31*a* is counted by the associated counter circuits 41*a*.

When the phase decision detection time control terminal (IN_LD) is at a high level, such that a command for deciding the center phase is issued, the operation in the counters 41*a* is halted, and the maximum value decision circuit 50*a* (DEC) decides the maximum one of the respective magnitudes output by the counters 41*a*. The 3:1 selector circuit 60*a* decides the center phase based on the decision as given by the maximum value decision circuit 50*a*.

The 3:1 selector circuit 60*a* has three input ports D0, D1, and D2 for receiving respectively the signal output from output ports 12 (sp A, sp B, and sp C) of the 1:4 serial to parallel converter circuit 10*a* and has an input port S for receiving the decision result output from the maximum value decision circuit 50*a*.

In the embodiment shown in FIG. 3, the counter 41*a* of the counter cnt A detects the maximum "10000" phase non-coincidences. This counter 41*a* of the counter cnt A has counted the number of times of non-coincidence of parallel data output from the output ports 31*a* of the output port sp A and the output port sp B. Thus, the phase of the parallel data output from the output port 31*a* of the output port sp C, which is most apart from the phase of sp A and the phase of sp B, is decided to be the center phase.

In the decision processing, the purport that, when the count value of the cnt A counter 41*a* is maximum, the phase of the output port sp C, which is most apart from the output ports sp A and sp B, is decided to be the center phase, is preset, whereby the 3:1 selector circuit 60*a* is able to reference the setting to decide on the center phase. In such case, it is also set so that, when the counter cnt B or the counter cnt C is maximum, the phase of the output terminal sp A or the phase of the output terminal sp B is determined to be the center phase, respectively.

With the present embodiment, described above, the data signal may at all times be detected at the center phase, even when jitter components in the data signal has been produced with respect to the clock signal, thereby eliminating incorrect data transmission.

In the first embodiment of the present invention, shown in FIG. 1, there is shown the phase correction circuit 100 for deciding the center phase of the input data signal for outputting the appropriate data signal, the phase disturbance of which have been corrected based on the so decided center phase. It is however similarly possible in another embodiment to construct the circuit according to the present invention as a center phase decision circuit adapted for outputting the decided center phase.

In the embodiment for constructing the center phase decision circuit, the center phase is determined based on the decision made by the maximum value decision circuit 50, in place of by the selector circuit 60 of FIG. 1, in the same way as by the selector circuit 60 of FIG. 1, and the center phase, so decided, is output. The center phase output by the center phase decision circuit of the present embodiment may be provided to a circuit adapted for correcting other data signal, or to a circuit for reading out data signal, for use in the processing in these circuits.

In the embodiment of FIG. 2, the center phase is detected for the three phase case. By a similar structure, such a circuit may be constructed which is able to decide the center phase of a n-phase case, where n is optional and n>=2. For example, in the four phase case, a four-phase center phase decision circuit or a four-phase phase correction circuit can be constructed in similar manner.

Although the present invention has been described with reference to its embodiment and preferred embodiment, the present invention is not to be limited to these specific embodiments and can be modified in many ways within the scope of its technical concept as defined in the claims.

The meritorious effects of the present invention are summarized as follows.

According to the present invention, as described above, data signal can at all times be detected at the center phase, even in case jitter component has been produced in the data signal with respect to a clock signal, thereby eliminating the occurrence of erroneous data transmission.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A center phase decision circuit for deciding a center phase of data signal input as n-phase serial data, where n is an integer not less than 2, comprising:

a serial to parallel converter circuit for outputting, via a plural number of output ports, parallel data obtained on serial to parallel conversion of said data signal at a period equal to n times the period of the data signal;

a phase comparator circuit for comparing phases of parallel data output from each of said output ports for detecting phase non-coincidence;

a counter for counting the number of times of detection of phase non-coincidence in each of said output ports by said phase comparator circuit; and a circuit for deciding said center phase based on the counted number of times of occurrences of phase non-coincidence.

2. The center phase decision circuit as defined in claim 1, wherein said serial to parallel converter circuit outputs parallel data, obtained on serial to parallel conversion of bits of respective periods of said data signal, at a period equal to n times the period of said data signal, from each of (n+1) output ports; and wherein said phase comparator circuit compares the phase of said parallel data output by the output port, to which the i-th period of said data signal, where i=1 to n, has been assigned, with the phase of the parallel data output by the output port to which the (i+1)-th period of said data signal has been assigned, to detect possible phase non-coincidence therebetween.

3. The center phase decision circuit as defined in claim 1, comprising:

a maximum value decision circuit for detecting the output port in which the number of times of occurrence of phase non-coincidence as counted by said counter is of a maximum value; and a circuit for selecting the center phase based on a preset correspondence relationship between the combination of the output ports in which the number of times of occurrence of the phase non-coincidence is maximum and the output port in which the phase of the output parallel data is determined to be said center phase.

4. A phase correction circuit for correcting phase disturbance of data signal input as n-phase serial data, where n is an integer not less than 2, comprising:

a serial to parallel conversion circuit for outputting, via a plural number of output ports, parallel data obtained on serial to parallel conversion of said data signal at a period equal to n times the period of the data signal;

a phase comparator circuit for comparing phases of parallel data output from each of said output ports for detecting phase non-coincidence;

a counter for counting the number of times of detection of phase non-coincidence in each of said output ports by said phase comparator circuit; and a circuit for deciding said center phase based on the counted number of times of phase non-coincidence and for converting the serial to parallel converted data signal into serial data having the correct period based on the decided center phase to output resulting serial data.

5. The phase correction circuit as defined in claim 4, wherein said serial to parallel converter circuit outputs parallel data obtained on serial to parallel conversion of bits of respective periods of said data signal, from each of (n+1) output ports, for each period equal to n times the period of said data signal; and wherein said phase comparator circuit compares the phase of said parallel data output by the output port, to which i-th period of said data signal, where i=1 to n, has been assigned, with the phase of the parallel data output by the output port, to which (i+1)-th period of said data signal has been assigned, to detect possible phase non-coincidence therebetween.

6. The phase correction circuit as defined in claim 4, comprising:

a maximum detection circuit for detecting said output port in which the number of times of occurrences of phase non-coincidences as counted by said counter is of a maximum value; and a circuit for deciding the center phase based on a preset correspondence relationship between the combination of the output ports in which the number of times of occurrence of the phase non-coincidence is maximum and the output port in which the phase of the output parallel data is determined to be said center phase.

7. The phase correction circuit as defined in claim 5, comprising:

a maximum detection circuit for detecting said output port in which the number of times of occurrences of phase non-coincidences as counted by said counter is of a maximum value; and a circuit for deciding the center phase based on a preset correspondence relationship between the combination of the output ports in which the number of times of occurrence of the phase non-coincidence is maximum and the output port in which the phase of the output parallel data is determined to be said center phase.

8. A method for deciding a center phase of data signal input as n-phase serial data, where n is an integer not less than 2, said method comprising the steps of:

serial to parallel converting said data signal to output parallel data obtained on the serial to parallel conversion at a period equal to n times the period of the data signal via a plural number of output ports;

comparing the phases of parallel data output from each of said output ports for detecting phase non-coincidence;

counting the number of times of detection of phase non-coincidence in each of said output ports; and deciding the center phase based on the counted number of times of detection of phase non-coincidence.

9. The method as defined in claim 8, wherein in the step of the serial to parallel conversion, the parallel data, obtained on serial to parallel conversion of bits of respective periods of said data signal, at a period equal to n times the period of said data signal, are output from each of (n+1) output ports; and wherein in the step of the phase comparison, the phase of said parallel data, output by the output port, to which i-th period of said data signal, where i=1 to n, has been assigned, with the phase of the parallel data output by the output port, to which (i+1)-th period of said data signal has been assigned, are compared to detect possible phase non-coincidence therebetween.

10. The method as defined in claim 8, further comprising the steps of:

detecting the output port in which the number of times of occurrences of phase non-coincidences as counted by said counter is of a maximum value; and deciding the center phase based on a preset correspondence relationship between the combination of the output ports in which the number of times of occurrence of the phase non-coincidence is maximum and the output port in which the phase of the output parallel data is determined to be said center phase.

11. The method as defined in claim 9, further comprising the steps of:

detecting the output port in which the number of times of occurrences of phase non-coincidences as counted by said counter is of a maximum value; and deciding the center phase based on a preset correspondence relationship between the combination of the output ports in which the number of times of occurrence of the phase non-coincidence is maximum and the output port in which the phase of the output parallel data is determined to be said center phase.

12. A circuit for deciding a center phase of data signal input as n-phase serial data, where n is an integer not less than 2, said circuit comprising:

a serial to parallel converter circuit having a serial data input port for receiving serial data bit stream, and n+1 pieces of output ports for outputting n+1 bits data in parallel obtained on serial to parallel conversion of said serial data at a period equal to n times the period of said data signal;

a phase comparator circuit comprised of n pieces of comparators, i-th comparator (where i=1 to n) having two input ports for receiving a pair of signals output respectively from i-th and (i+1)-th output ports of said serial to parallel converter circuit to compare phases of the pair of said signals for detecting possible phase non-coincidence therebetween to output a comparison result;

a counter circuit comprised of n pieces of counters, each receiving the comparison result output from the associated comparator for counting the number of times of phase non-coincidence detected by the associated comparator;

a maximum value decision circuit having n pieces of input port for receiving n pieces of count values output respectively by said n pieces of counters for detecting the counter which is of the maximum value in the counted number of times of occurrence of phase non-coincidence; and a selector circuit having n pieces of input ports for receiving data output in parallel from said 1st to n-th output ports of said serial to parallel converter circuit and an input port for receiving the detection result from the maximum value decision circuit to select a signal as the center phase based on the maximum value detection result from among the signals received in parallel at said n pieces of input ports for outputting the selected signal from an output port.

13. The circuit as defined in claim 12, wherein each of said counters in said counter circuit, having a control signal input port for receiving a control signal provided in common to said counters, is adapted to operate and to be halted respectively in accordance with said control signal being set in an inactive state and in an active state, and wherein said maximum value decision circuit, having a control signal input port for receiving said control signal, executes the maximum value detection operation in case of said control signal being set in the active state.

* * * * *